(12) United States Patent
Lin et al.

(10) Patent No.: US 8,822,290 B2
(45) Date of Patent: Sep. 2, 2014

(54) FINFETS AND METHODS FOR FORMING THE SAME

(71) Applicant: Taiwan Semiconductor Manufacturing Company, Ltd., Hsin-Chu (TW)

(72) Inventors: Hung-Ta Lin, Hsin-Chu (TW); Meng-Ku Chen, New Taipei (TW); Huicheng Chang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/750,883

(22) Filed: Jan. 25, 2013

(65) Prior Publication Data

US 2014/0213031 A1 Jul. 31, 2014

(51) Int. Cl.
*H01L 21/336* (2006.01)
*H01L 21/20* (2006.01)
*H01L 21/265* (2006.01)
*H01L 21/425* (2006.01)
*H01L 29/66* (2006.01)
*H01L 29/78* (2006.01)

(52) U.S. Cl.
CPC ............................... *H01L 29/66545* (2013.01)
USPC ........... 438/283; 438/478; 438/585; 438/299; 438/285; 438/514; 257/E21.131; 257/E21.421; 257/E21.409; 257/E21.444; 257/E21.101; 257/E21.11

(58) Field of Classification Search
USPC .......................................................... 438/294
See application file for complete search history.

(56) References Cited

U.S. PATENT DOCUMENTS

| | | | | |
|---|---|---|---|---|
| 8,614,127 | B1 * | 12/2013 | Yang et al. | 438/270 |
| 2007/0111439 | A1 * | 5/2007 | Jung et al. | 438/254 |
| 2010/0276761 | A1 * | 11/2010 | Tung et al. | 257/384 |
| 2011/0143505 | A1 * | 6/2011 | Ahn et al. | 438/186 |
| 2011/0156004 | A1 * | 6/2011 | Radosavljevic et al. | 257/24 |
| 2013/0285141 | A1 * | 10/2013 | Kuo et al. | 257/347 |

* cited by examiner

*Primary Examiner* — Colleen A Matthews
*Assistant Examiner* — Regan J Rundio
(74) *Attorney, Agent, or Firm* — Slater & Matsil, L.L.P.

(57) ABSTRACT

A method includes recessing isolation regions, wherein a portion of a semiconductor strip between the isolation regions is over top surfaces of the recessed isolation regions, and forms a semiconductor fin. A dummy gate is formed to cover a middle portion of the semiconductor fin. An Inter-Layer Dielectric (ILD) is formed to cover end portions of the semiconductor fin. The dummy gate is then removed to form a first recess, wherein the middle portion is exposed to the first recess. The middle portion of the semiconductor fin is removed to form a second recess. An epitaxy is performed to grow a semiconductor material in the second recess, wherein the semiconductor material is between the end portions. A gate dielectric and a gate electrode are formed in the first recess. The gate dielectric and the gate electrode are over the semiconductor material.

20 Claims, 15 Drawing Sheets

FINFETS AND METHODS FOR FORMING THE SAME

BACKGROUND

The speed of metal-oxide-semiconductor (MOS) transistors is closely related to the drive currents of the MOS transistors, which drive currents are further closely related to the mobility of charges. For example, NMOS transistors have high drive currents when the electron mobility in their channel regions is high, while PMOS transistors have high drive currents when the hole mobility in their channel regions is high.

Compound semiconductor materials of group III and group V elements (referred to as III-V compound semiconductors hereinafter) are good candidates for forming transistors due to their high electron mobility. Therefore, III-V based transistors have been explored. III-V compound semiconductor films, however, need to be grown on other substrates because it is difficult to obtain bulk III-V crystals. The growth of III-V compound semiconductor films on dissimilar substrates faces difficulties because these substrates have lattice constants and thermal expansion coefficients different than that of the III-V compound semiconductors. Various methods have been used to form high quality III-V compound semiconductors. For example, III-V compound semiconductors were grown from trenches between shallow trench isolation regions to reduce the number of threading dislocations. Fin Field-Effect Transistors (FinFETs) are formed based on the resulting III-V compound semiconductors. Since PMOS and NMOS transistors have their channels and source and drain regions grown at the same time, the epitaxy processes of PMOS and NMOS transistors need to be separated, so that the well regions of the PMOS and NMOS transistors may have different conductivity types.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 11C are perspective views and cross-sectional views of intermediate stages in the manufacturing of a Fin Field-Effect Transistor (FinFET) in accordance with some exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Fin Field-Effect Transistors (FinFETs) and the methods of forming the same are provided in accordance with various embodiments. The intermediate stages of forming the FinFETs are illustrated. The variations of the embodiments are discussed. Throughout the various views and illustrative embodiments, like reference numbers are used to designate like elements.

Figure 1:
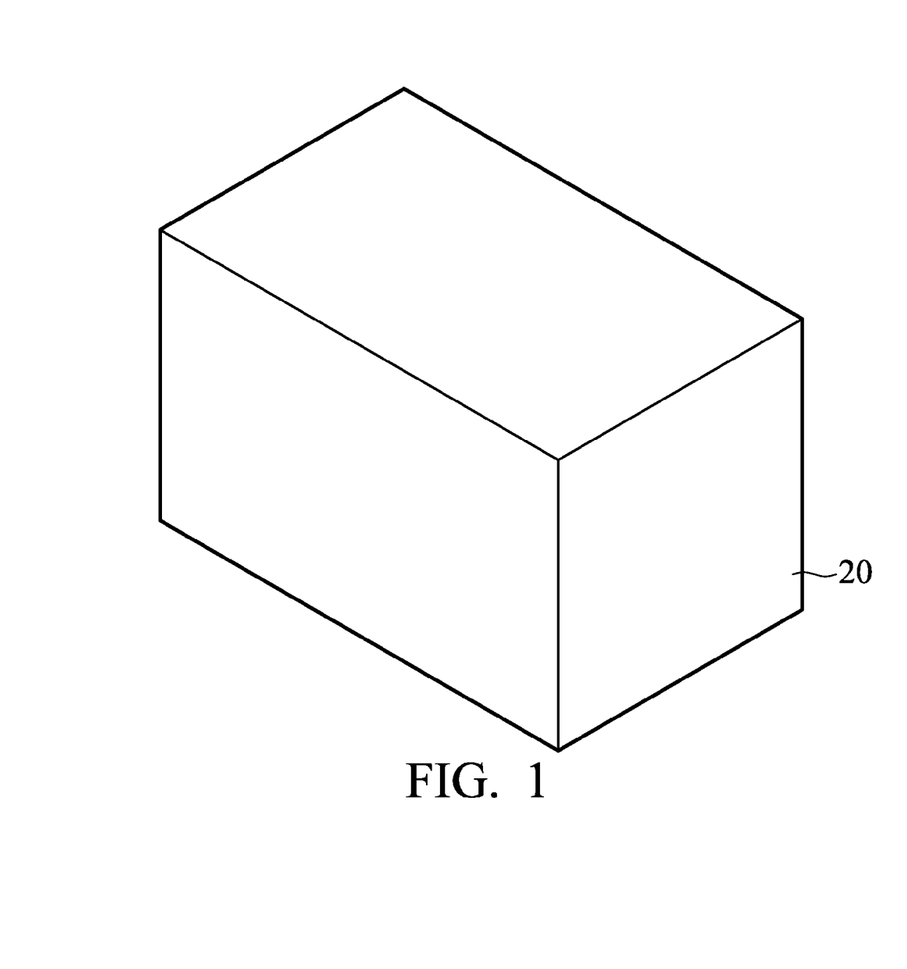

FIGS. 1 through 11C are cross-sectional views and perspective views of intermediate stages in the manufacturing of a FinFET in accordance with some exemplary embodiments. FIG. 1 illustrates a perspective view of substrate 20, which may be a part of a wafer. Substrate 20 may be a semiconductor substrate, which may further be a silicon substrate, a silicon carbon substrate, or a substrate formed of other semiconductor materials. Substrate 20 may be lightly doped with a p-type or an n-type impurity.

Figure 2:
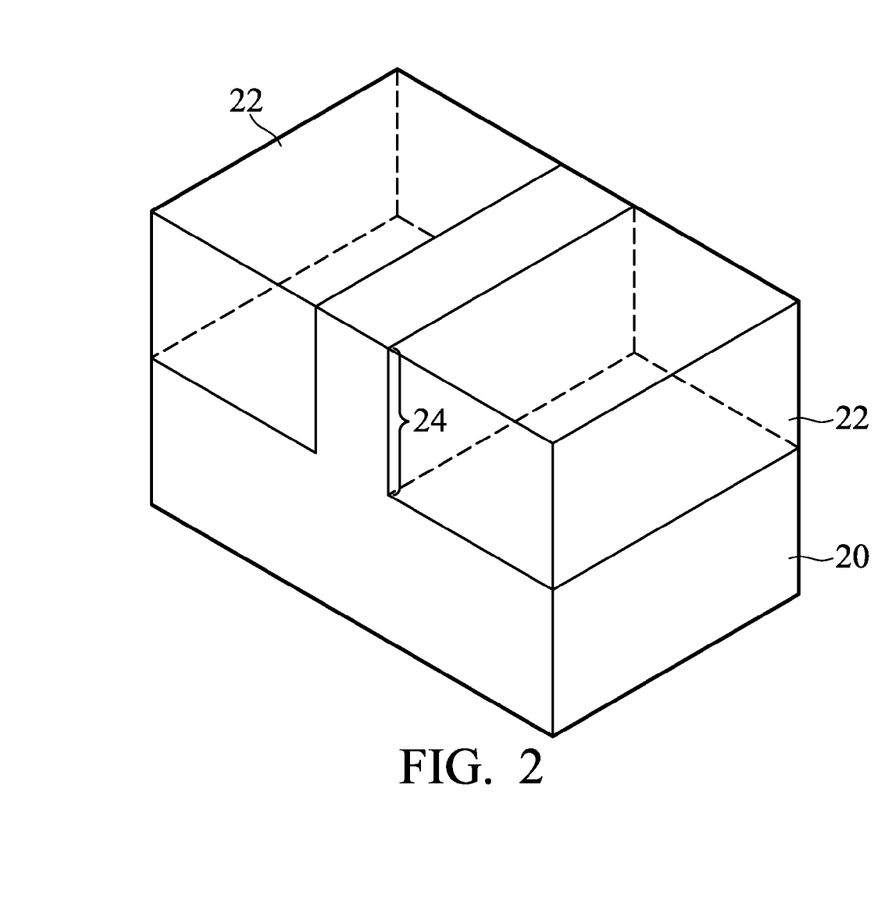

Next, referring to FIG. 2, isolation regions 22 are formed, which extend from a top surface of substrate 20 into substrate 20. Isolation regions 22 may be Shallow Trench Isolation (STI) regions, and are referred to as STI region 22 hereinafter. The formation of STI regions 22 may include etching semiconductor substrate 20 to form trenches (not shown), and filling the trenches with a dielectric material to form STI regions 22. STI regions 22 may be formed of silicon oxide, for example, although other dielectric materials may also be used. The portion of substrate 20 between neighboring STI regions 22 is referred to as semiconductor strip 24 throughout the description. The top surface of semiconductor strip 24 and the top surfaces of STI regions 22 may be substantially level with each other, although they may be at slightly different levels.

Figure 3:
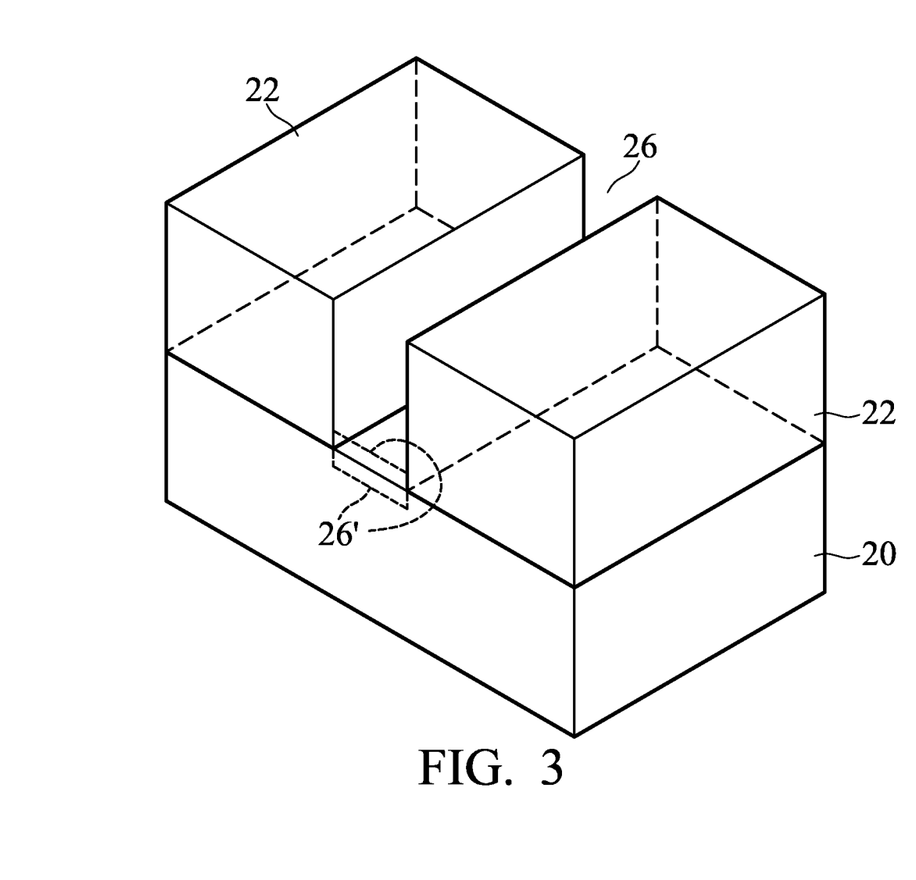

Referring to FIG. 3, at least a top portion of, or substantially an entirety of, semiconductor strip 24 is removed. Accordingly, recess 26 is formed between STI regions 22. The bottom surface of recess 26 may be level with the bottom surfaces of STI regions 22. Alternatively, the bottom surface of recess 26 may be higher than or lower than the bottom surfaces of STI regions 22, wherein dashed lines 26' illustrate the likely positions of the respective bottoms of recess 26.

Figure 4:
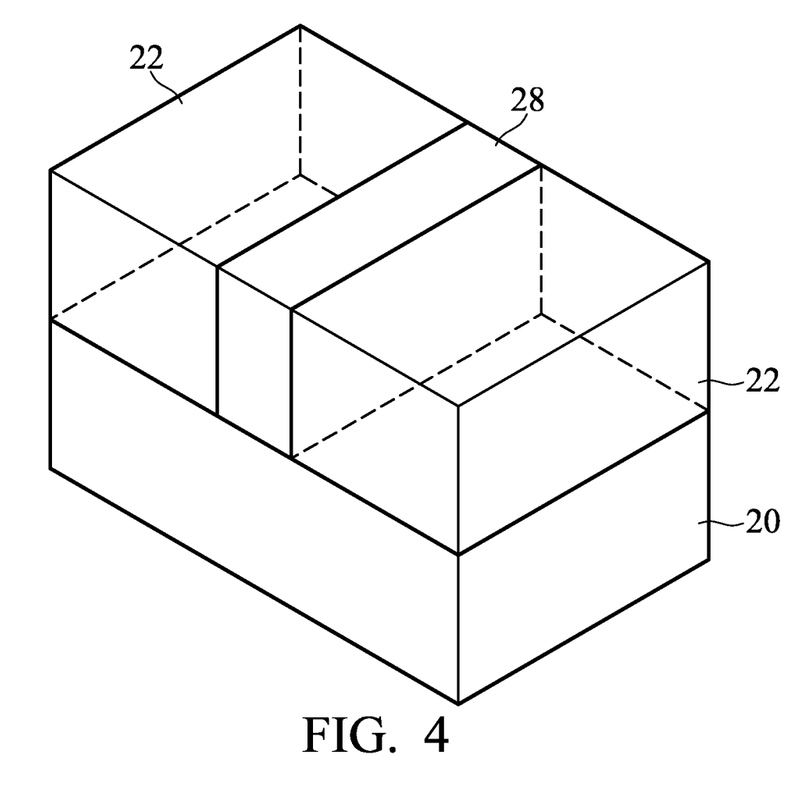

An epitaxy is performed to grow a semiconductor region in recess 26. The resulting structure is shown in FIG. 4, wherein the epitaxy semiconductor forms semiconductor strip 28. A Chemical Mechanical Polish (CMP) may be performed to level the top surface of semiconductor strip 28 with the top surfaces of STI regions 22. Semiconductor strip 28 may have a lattice constant greater than, substantially equal to, or smaller than, the lattice constant of substrate 20. In some embodiments, semiconductor strip 28 comprises silicon germanium, silicon carbon, pure or substantially pure germanium, a III-V compound semiconductor, a II-VI compound semiconductor, or the like. For example, the available materials for forming III-V compound semiconductor strip 28 include, but are not limited to, InAs, AlAs, GaAs, InP, GaN, InGaAs, InAlAs, GaSb, AlSb, AlP, GaP, and the like. The top surface of the resulting semiconductor strips 28 may be higher than, level with, or lower than the top surface of STI regions 22. In an exemplary embodiment, semiconductor strip 28 comprises InGaAs.

In some embodiments, semiconductor strip 28 is in-situ doped during the epitaxy to have an n-type or p-type conductivity. In alternative embodiments, semiconductor strip 28 is intrinsic, and is not doped during and after the epitaxy. Semiconductor strip 28 may be unintentionally doped due to the use of the precursor for growing semiconductor strip 28. When semiconductor strip 28 is doped after the epitaxy, the doping may be performed through an implantation of the desirable impurity. In some embodiments in which semiconductor strip 28 comprises a III-V compound semiconductor, the impurity that may be doped to cause semiconductor strip 28 to be n-type comprises Si, Te, or the like, and the impurity that may be doped to cause semiconductor strip 28 to be p-type comprises C, Zn, or the like. After the doping, semiconductor strip 28 may be lightly-doped n-type (referred to as n−) or lightly-doped p-type (referred to as p−). Alternatively, semiconductor strip 28 may be heavily-doped n-type (referred to as n+) or heavily-doped p-type (referred to as p+). In yet alternative embodiments, semiconductor strip 28 may be moderately-doped n-type (referred to as n) or moderately-doped p-type (referred to as p). In the described embodiments, the term "heavily doped" means an impurity concentration of above about $10^{19}/cm^3$, the term "lightly doped" means an impurity concentration lower than about $10^{13}/cm^3$, and the term "moderately doped" means an impurity concentration higher than lightly doped and lower than heavily doped. One skilled in the art will recognize, however, that "heavily doped," "moderately doped," and "lightly doped" are terms of art that depend upon the specific device type, technology generation, minimum feature size, and the like. It is intended, therefore, that the terms be interpreted in light of the technology being evaluated and not be limited to the described embodiments.

In some embodiments, the process steps in FIGS. 3 and 4 are skipped, and semiconductor strip 24 in FIG. 2 remains. In which embodiments, semiconductor strip 24 in FIG. 2 is also referred to as semiconductor strip 28. In these embodiments, the resulting semiconductor strip 28 as in FIG. 4 is formed of the same semiconductor material as semiconductor substrate 20. An implantation may be performed to dope semiconductor strip 28 as a p+/p/p− type when the respective FinFET 60 (FIG. 11A) is a p-type FinFET, or dope semiconductor strip 28 as n+/n/n− type when the respective FinFET 60 (FIG. 11A) is an n-type FinFET.

Figure 5:
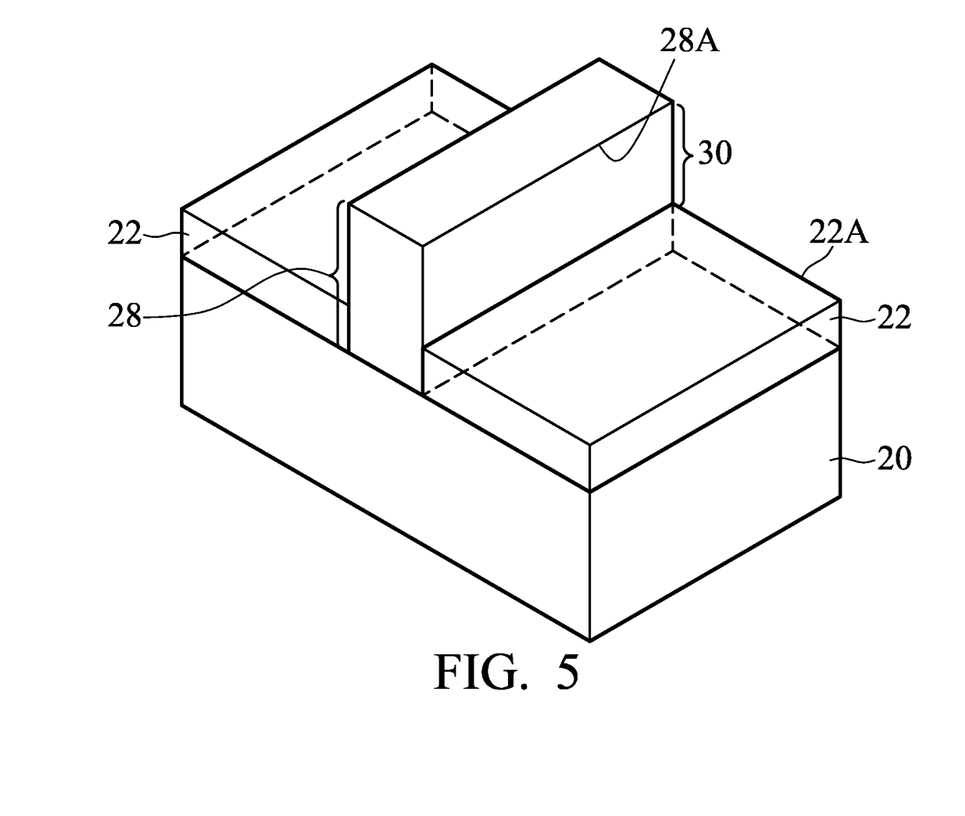

Referring to FIG. 5, STI regions 22 are recessed, for example, through an etching step. The top surfaces 22A of the remaining STI regions 22 is thus lower than top surface 28A of semiconductor strip 28. Throughout the description, the portion of semiconductor strip 28 over top surface 22A is referred to as semiconductor fin 30.

Figure 6:
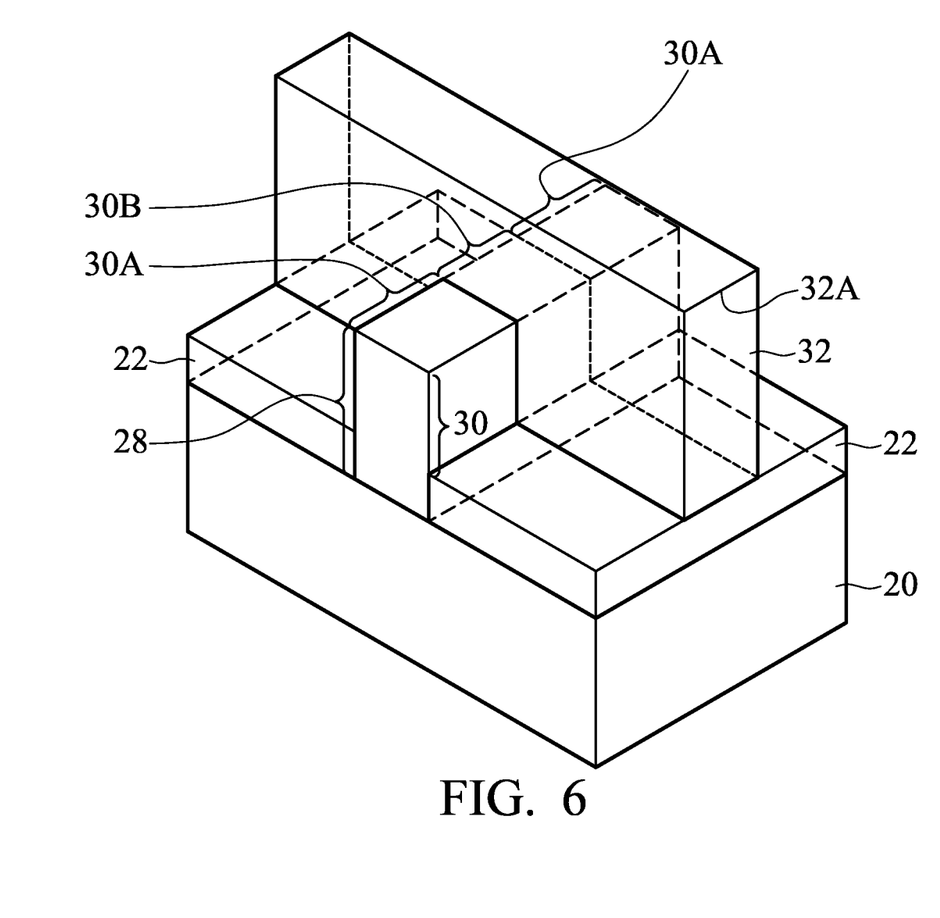

Referring to FIG. 6, dummy gate 32 is formed. Dummy gate 32 may be formed of, for example, polysilicon, although other materials that have a high etching selectivity from the etching of STI regions 22 may also be used. Dummy gate 32 may also be formed of a material that has a high etching selectivity from the etching of semiconductor strip 28 in accordance with some embodiments. In some embodiments, dummy gate 32 has a composite structure comprising a plurality of layers, and may include, for example, a silicon nitride layer as a bottom layer (not shown), and a top layer (not shown) over the bottom layer, wherein the top layer may be a polysilicon layer, for example. Dummy gate 32 has top surface 32A higher than the top surface of semiconductor fin 30. The formation of dummy gate 32 may include forming blank layer(s), performing a CMP to level the top surface of the blank layer(s), and patterning the blank layers. The remaining portion of the blank layers(s) is dummy gate 32. Dummy gate 32 covers middle portion 30B of semiconductor fin 30, and opposite end portions 30A of semiconductor fin 30 are not covered. Dummy gate 32 may also have a lengthwise direction substantially perpendicular to the lengthwise direction of semiconductor fin 30.

Figure 7:
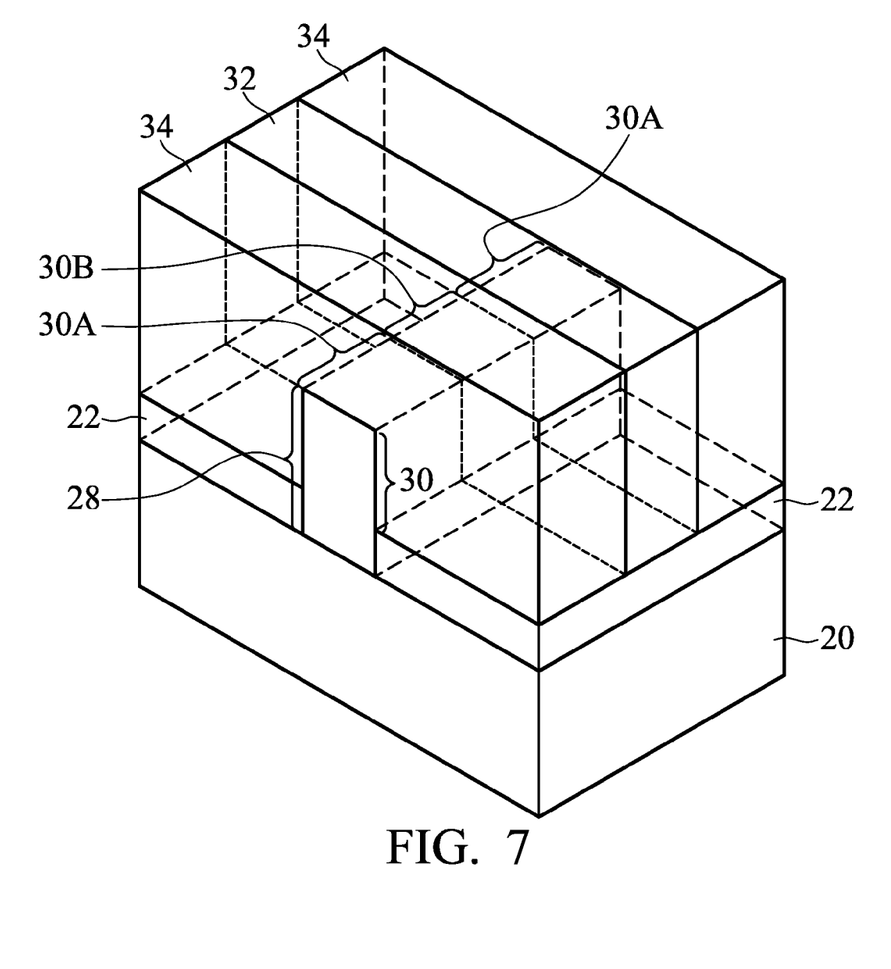

FIG. 7 illustrates a perspective view of the structure after Inter-Layer Dielectric (ILD) 34 is formed. ILD 34 is formed of a dielectric material such as Phospho-Silicate Glass (PSG), Boro-Silicate Glass (BSG), Boron-Doped Phospho-Silicate Glass (BPSG), or the like. A CMP may be performed to level the top surface of ILD 34 with the top surface of dummy gate 32. Accordingly, the end portions 30A of semiconductor fin 30 are buried under the top portions of ILD 34. The lower portions of ILD 34 extend to level with end portions 30A of semiconductor fin 30. Although not shown, spacers may be formed on the opposite sidewalls of dummy gate 32, wherein the spacers may be formed of a material different from the materials of ILD 34 and dummy gate 32.

Figure 8:
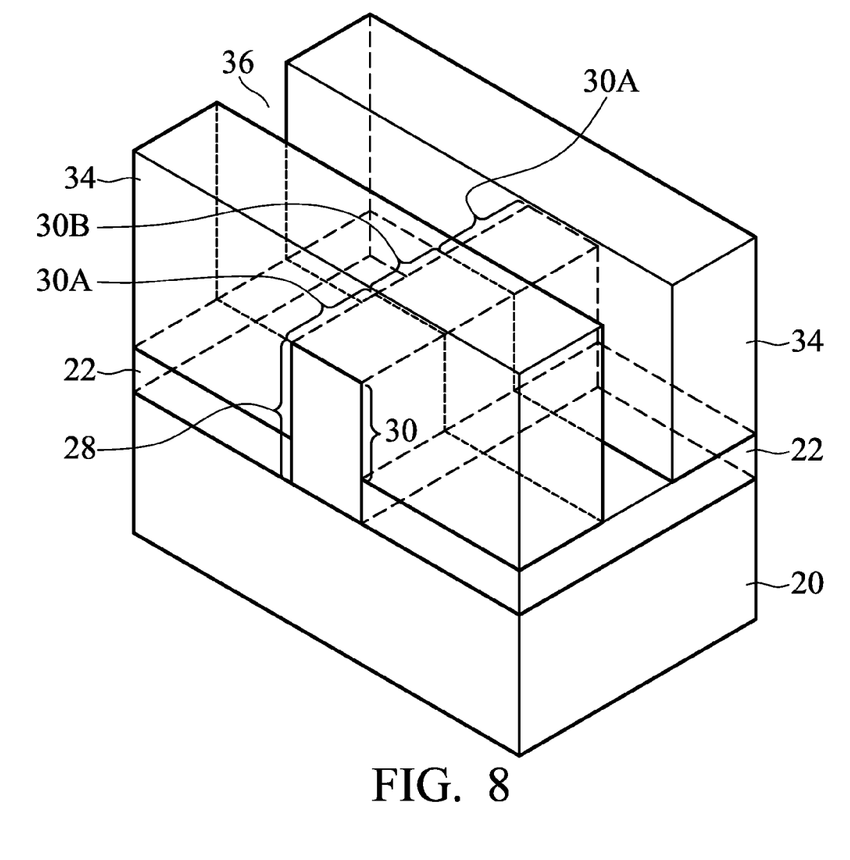

Next, referring to FIG. 8, dummy gate 32 is removed in an etching step, so that recess 36 is formed in ILD 34. The middle portion 30B of semiconductor fin 30 is exposed to recess 36. In the embodiments wherein dummy gate 32 is a composite gate, the bottom layer (such as a silicon nitride layer) of dummy gate 32 may be used as an etch stop layer when the top layer (such as a polysilicon layer) of dummy gate 32 is etched. The bottom layer of dummy gate 32 may then be removed after the removal of the top layer of dummy gate 32.

Figure 9A:
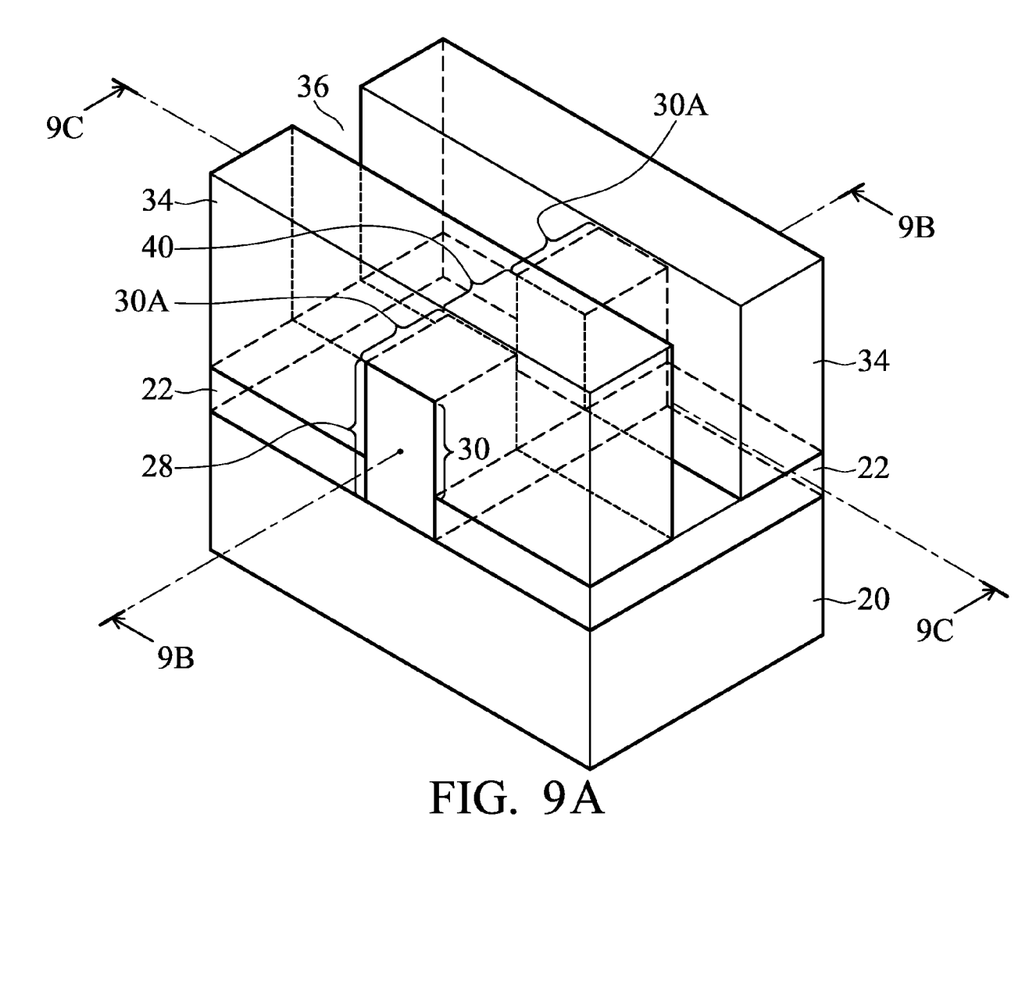
Figure 9B:
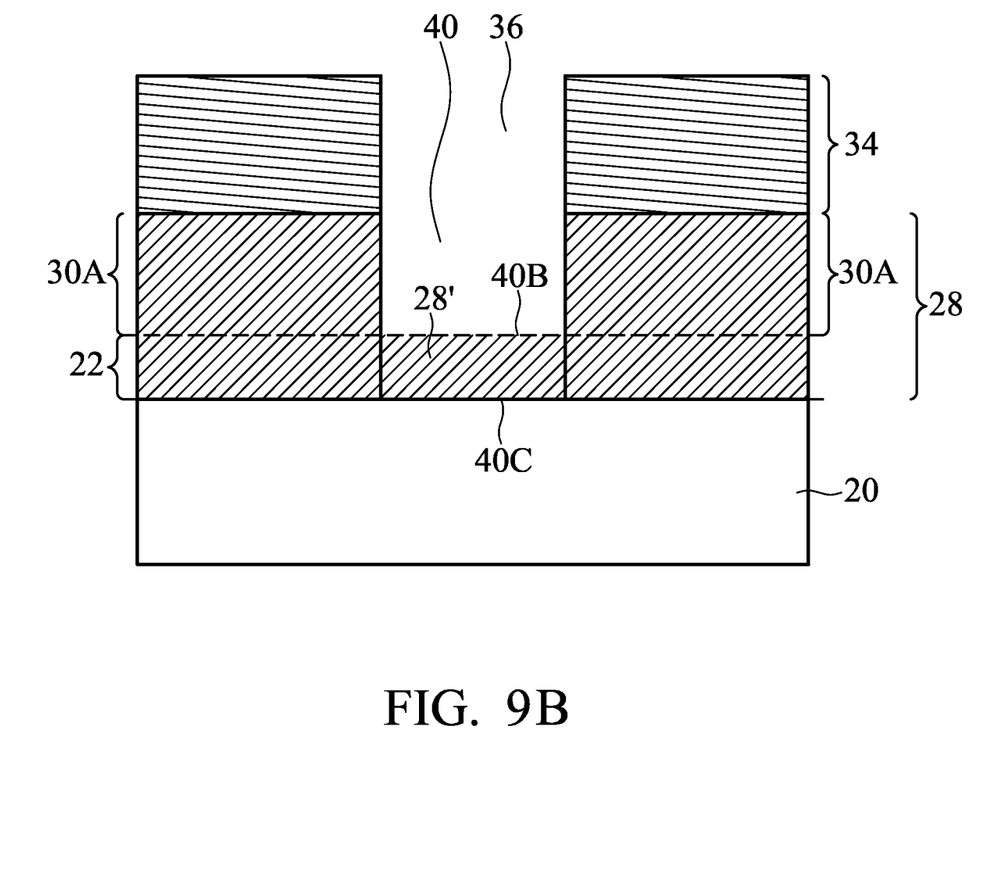
Figure 9C:
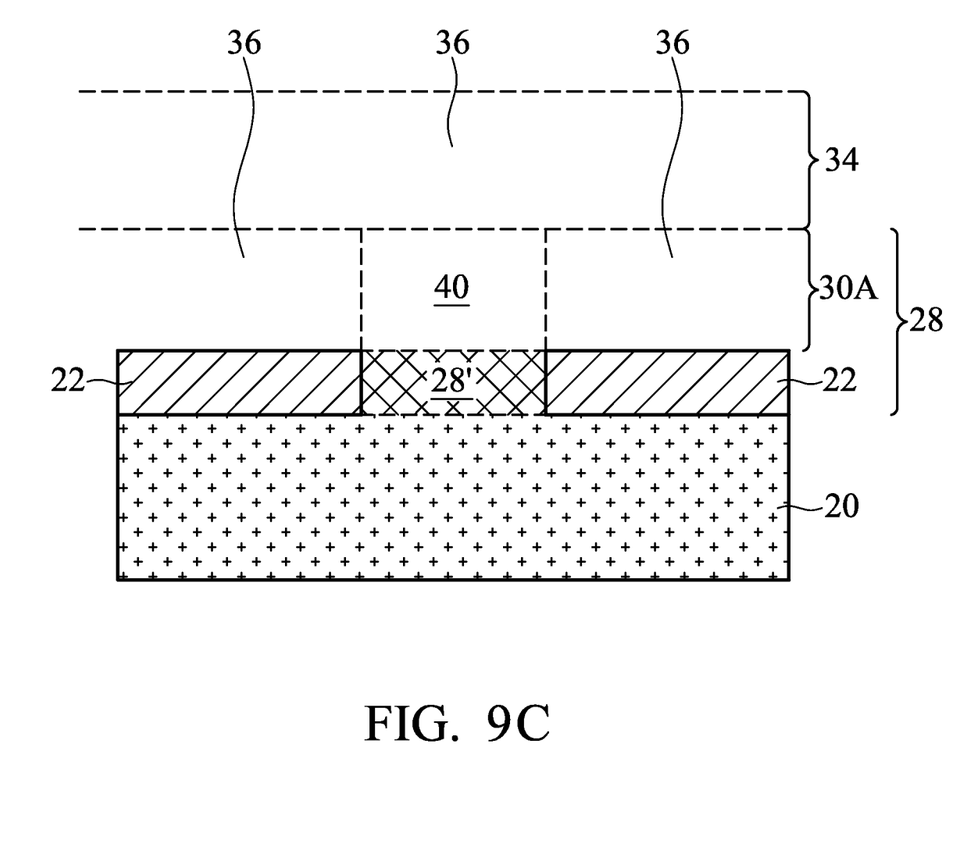

In FIG. 9A, a further etch is performed using an etchant that attacks semiconductor strip 28, and does not attack ILD 34 and STI regions 22. After the etching, the middle portion 30B (FIG. 8) of semiconductor fin 30 is removed, and the respective space left by the removed semiconductor material in this step is referred to as recess 40, which forms a continuous recess with recess 36. The etching may be an anisotropic etch step in accordance with some embodiments, so that end portions 30A of semiconductor fin 30 are not etched. FIGS. 9B and 9C illustrate the cross-sectional views of the structure in FIG. 9A, wherein FIG. 9B is obtained from the plane crossing line 9B-9B in FIG. 9A, and FIG. 9C is obtained from the plane crossing line 9C-9C in FIG. 9A.

Referring to FIG. 9B, in some embodiments, middle portion 30B (FIG. 8) of semiconductor fin 30 is etched, and the portion 28' of semiconductor strip 28 between (and level with) STI regions 22 is not etched. The bottom surface of the respective recess 40 is substantially level with the top surfaces of STI regions 22. The respective bottom surface of recess 40 is illustrated using dashed line 40B. In alternative embodiments, portion 28' of semiconductor strip 28 between STI regions 22 is also etched, and the respective bottom surface of recess 40 is illustrated using dashed line 40C. Since STI regions 22 are not in the plane shown in FIG. 9B, the top surfaces and the bottom surfaces of STI regions 22 are marked in FIG. 9B using dashed lines. Similarly, semiconductor fin portions 30A and ILD 34 are not in the plane shown in FIG. 9C, and hence the top surfaces and the bottom surfaces of semiconductor fin portions 30A and ILD 34 are marked in FIG. 9C using dashed lines.

Figure 10:
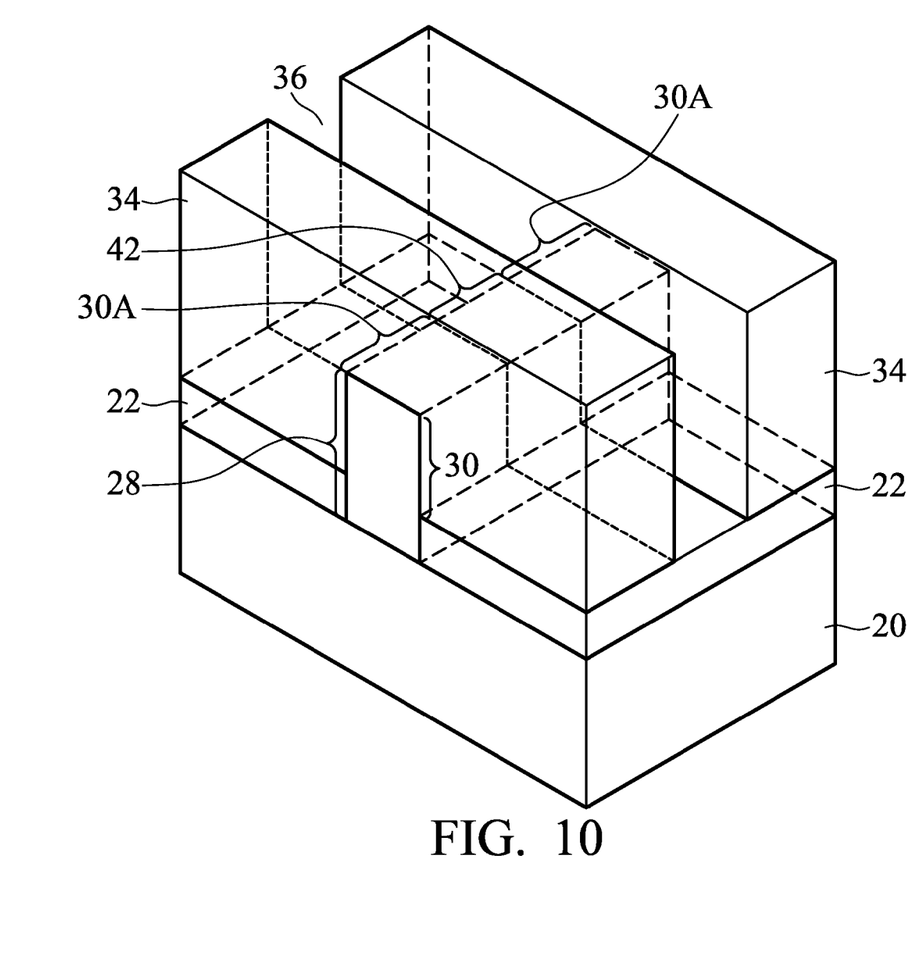
Figure 11A:
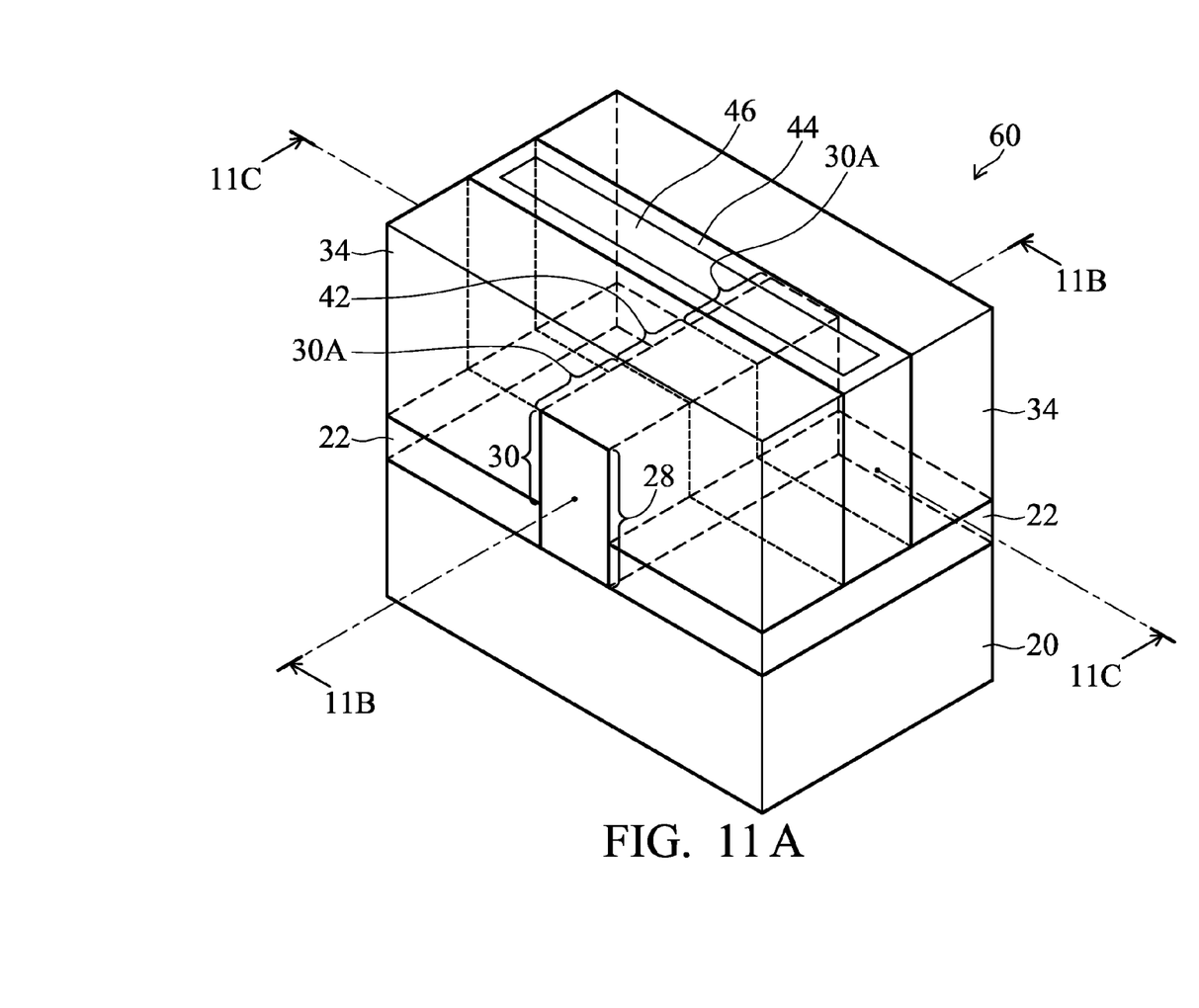

FIG. 10 illustrates the epitaxy for the regrowth of semiconductor fin 42. Semiconductor fin 42 forms the channel portion of the respective FinFET 60 (FIG. 11A). Semiconductor fin 42 may be formed of a semiconductor material selected from silicon, silicon germanium, pure or substantially pure germanium, a III-V compound semiconductor (such as InGaAs), a II-VI compound semiconductor, and the like. In some embodiments, semiconductor fin 42 is intrinsic, and is neither doped as p-type nor doped as n-type. By making semiconductor fin 42 to be intrinsic, the process of the embodiments may be used to form p-type FinFETs and n-type FinFETs simultaneously. The channel regions of the respective p-type FinFETs and n-type FinFETs may be grown simultaneously, and hence production cost is reduced. Alternatively, when the respective device is a p-type FinFET, semiconductor fin 42 is doped to be n-type (for example, n−). Conversely, when the respective device is an n-type FinFET, semiconductor fin 42 is doped to be p-type (for example, p−).

Figure 11B:
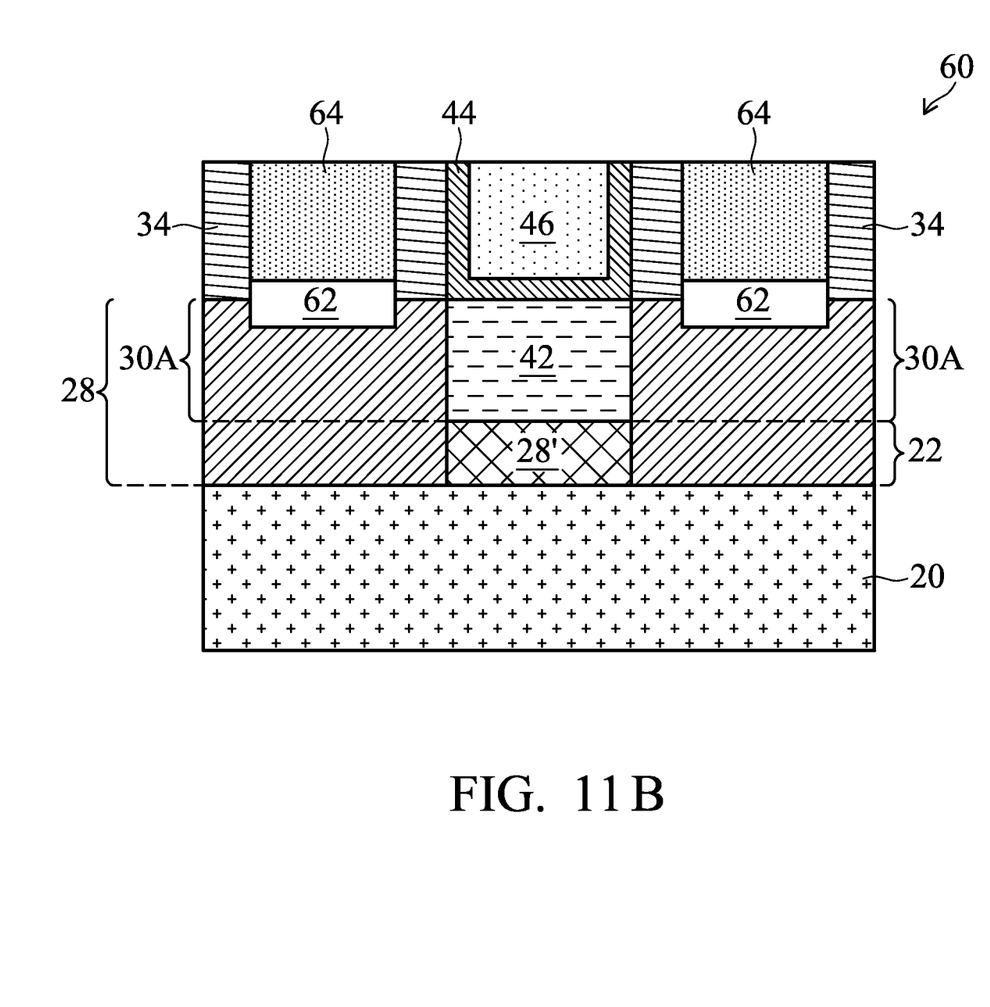
Figure 11C:
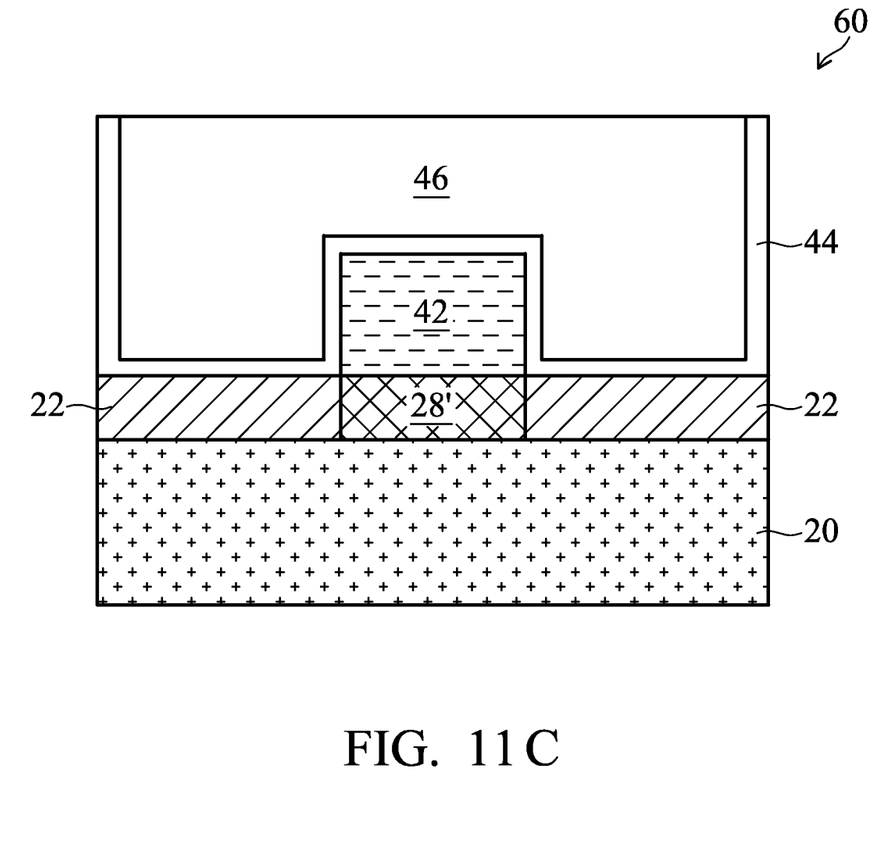

FIG. 11A illustrates the formation of gate dielectric 44 and gate electrode 46. FIGS. 11B and 11C illustrate the cross-sectional views of the structure in FIG. 11A, wherein the cross-sectional views in FIGS. 11B and 11C are obtained from the same planes that cross lines 11B-11B and 11C-11C, respectively, in FIG. 11A. For clarity, the buried portions of gate dielectric 44 and gate electrode 46 are not shown in FIG. 11A, and may be found referring to FIGS. 11B and 11C.

The intermediate stages in the formation of gate dielectric 44 and gate electrode 46 are not illustrated, and are described briefly below referring to FIGS. 10, 11A, 11B, and 11C. In the formation process, gate dielectric layer 44 is formed as a blanket layer in recess 36 (FIG. 10) and on the top surfaces and the sidewalls of semiconductor fin 42 and ILD 34 (also see FIG. 10). In accordance with some embodiments, gate dielectric layer 44 comprises silicon oxide, silicon nitride, or multilayers thereof. In alternative embodiments, gate dielectric layer 44 comprises a high-k dielectric material. In which embodiments, gate dielectric layer 44 may have a k value greater than about 7.0, and may include a metal oxide or a silicate of Hf, Al, Zr, La, Mg, Ba, Ti, Pb, and combinations thereof. The formation methods of gate dielectric layer 44 may include Molecular-Beam Deposition (MBD), Atomic Layer Deposition (ALD), Plasma Enhanced Chemical Vapor Deposition (PECVD), and the like. Next, conductive material 46 is formed over gate dielectric layer 44, and fills the remaining recess 36 (FIG. 10). Conductive material 46 may comprise a metal-containing material such as TiN, TaN, TaC, Co, Ru, Al, combinations thereof, or multi-layers thereof. After the filling of conductive material 46, a CMP may be performed to remove the excess portions of gate dielectric layer 44 and conductive material 46, which excess portions are over the top surface of ILD 34. The resulting remaining portions of conductive material 46 and gate dielectric layer 44 thus form a replacement gate of the resulting FinFET 60 (FIGS. 11A, 11B, and 11C).

FIG. 11B also illustrates, in addition to the formation of gate dielectric 44 and gate electrode 46, the formation of source and drain silicide regions 62 and source/drain contact plugs 64, which are not shown in FIG. 11A for clarity. The formation process include forming openings (occupied by contact plugs 64) in ILD 34 to expose end portions 30A of semiconductor fins 30. In some embodiments in which end portions 30A are heavily doped as p+ or n+ regions, no further implantation is performed. Alternatively, end portions 30A may be heavily doped as p+ or n+ regions through the openings. A silicidation is then performed to silicide the exposed end portions 30A to form source/drain silicide regions 62. Contact plugs 64 are then formed to fill the openings. In the resulting FinFET 60, end portions 30A form source and drain regions of FinFET 60.

In accordance with some embodiments, a method includes recessing isolation regions, wherein a portion of a semiconductor strip between the isolation regions is over top surfaces of the recessed isolation regions, and forms a semiconductor fin. A dummy gate is formed to cover a middle portion of the semiconductor fin. An Inter-Layer Dielectric (ILD) is formed to cover end portions of the semiconductor fin. The dummy gate is then removed to form a first recess, wherein the middle portion is exposed to the first recess. The middle portion of the semiconductor fin is removed to form a second recess. An epitaxy is performed to grow a semiconductor material in the second recess, wherein the semiconductor material is between the end portions. A gate dielectric and a gate electrode are formed in the first recess. The gate dielectric and the gate electrode are over the semiconductor material.

In accordance with other embodiments, a method includes forming a semiconductor fin, wherein the semiconductor fin is higher than top surfaces of isolation regions. The isolation regions are on opposite sides of the semiconductor fin. A middle portion and end portions of the semiconductor fin are heavily doped to p-type or n-type. A middle portion of the semiconductor fin is then replaced with a semiconductor material. A gate dielectric is formed on sidewalls and a top surface of the semiconductor material. A gate electrode is formed over the gate dielectric.

In accordance with yet other embodiments, a method includes forming isolation regions extending from a top surface of a semiconductor substrate into the semiconductor substrate, etching a portion of the semiconductor substrate between the isolation regions to form a first recess, performing a first epitaxy to form a semiconductor strip in the first recess, and recessing the isolation regions. A portion of the semiconductor strip over top surfaces of the recessed isolation regions forms a semiconductor fin. A dummy gate is formed to cover a middle portion of the semiconductor fin. An ILD is formed to cover end portions of the semiconductor fin, wherein the end portions of the semiconductor fin are on opposite sides of the middle portion. The dummy gate is removed to form a second recess. The middle portion of the semiconductor fin is removed to form a third recess. A second epitaxy is performed to grow a semiconductor material in the third recess. A gate dielectric and a gate electrode are then formed in the second recess.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   recessing isolation regions, wherein a portion of a semiconductor strip between the isolation regions is over top surfaces of the recessed isolation regions, and forms a semiconductor fin;
   forming a dummy gate to cover a middle portion of the semiconductor fin;
   forming an Inter-Layer Dielectric (ILD) to cover end portions of the semiconductor fin, wherein the end portions of the semiconductor fin are on opposite sides of the middle portion;
   removing the dummy gate to form a first recess, wherein the middle portion is exposed to the first recess;
   removing the middle portion of the semiconductor fin from the first recess to form a second recess;
   performing an epitaxy to grow a semiconductor material in the second recess, wherein the semiconductor material is between the end portions; and
   forming a gate dielectric and a gate electrode in the first recess, wherein the gate dielectric and the gate electrode are over the semiconductor material.

2. The method of claim 1 further comprising, before the step of recessing the isolation regions:
   etching a portion of a substrate to form a third recess, wherein the portion of the substrate is between the isolation regions; and
   performing an additional epitaxy to grow the semiconductor strip in the third recess.

3. The method of claim 2 further comprising in-situ doping the semiconductor strip heavily to p-type or n-type when the additional epitaxy proceeds.

4. The method of claim 2 further comprising, after the additional epitaxy, performing an implantation to dope the middle portion and the end portions heavily to p-type or n-type.

5. The method of claim 1, wherein the semiconductor material is grown to be intrinsic.

6. The method of claim 1 further comprising:
before the step of forming the dummy gate, etching a semiconductor substrate to form trenches;
filling the trenches with a dielectric material to form the isolation regions, wherein a portion of the semiconductor substrate between the isolation regions forms the semiconductor strip; and
before the step of forming the dummy gate, performing an implantation to dope the middle portion and the end portions heavily to p-type or n-type.

7. The method of claim 1 further comprising, after forming the gate dielectric and the gate electrode, forming contact plugs in the ILD, wherein the contact plugs are electrically coupled to the end portions of the semiconductor strip.

8. A method comprising:
forming a semiconductor fin, wherein the semiconductor fin is higher than top surfaces of isolation regions, wherein the isolation regions are on opposite sides of the semiconductor fin, and wherein a middle portion and end portions of the semiconductor fin are heavily doped to p-type or n-type;
replacing a middle portion of the semiconductor fin with a semiconductor material;
forming a gate dielectric on sidewalls and a top surface of the semiconductor material; and
forming a gate electrode over the gate dielectric.

9. The method of claim 8 further comprising, after the gate dielectric and the gate electrode are formed, forming contact plugs to electrically couple to the end portions of the semiconductor fin.

10. The method of claim 8, wherein the step of replacing the middle portion of the semiconductor fin comprises:
etching the middle portion of the semiconductor fin; and
performing an epitaxy to grow the semiconductor material in a space left by the etched middle portion of the semiconductor fin.

11. The method of claim 10 further comprising:
before the step of replacing the middle portion of the semiconductor fin, forming a dummy gate to cover the middle portion of the semiconductor fin;
forming an Inter-Layer Dielectric (ILD) to cover the end portions of the semiconductor fin;
removing the dummy gate to form a first recess;
performing the step of etching the middle portion of the semiconductor fin to form a second recess; and
performing the epitaxy, wherein the semiconductor material is grown in the second recess.

12. The method of claim 8, wherein the step of forming the semiconductor fin comprises:

etching a portion of a semiconductor substrate between the isolation regions to form a recess;
epitaxially growing a semiconductor strip in the recess; and
recessing the isolation regions, wherein a portion of the semiconductor strip between the isolation regions and over top surfaces of the isolation regions forms the semiconductor fin.

13. The method of claim 8, wherein the step of forming the semiconductor fin comprises:
etching portions of a semiconductor substrate to form trenches, wherein a portion of the semiconductor substrate is un-etched, and forms a semiconductor strip;
filling the trenches with a dielectric material to form the isolation regions; and
performing an implantation on the semiconductor strip to heavily dope the middle portion and the end portions of the semiconductor fin to p-type or n-type.

14. The method of claim 12 further comprising doping a p-type or an n-type impurity through in-situ doping during the growing the semiconductor strip in the recess.

15. A method comprising:
forming isolation regions extending from a top surface of a semiconductor substrate into the semiconductor substrate;
etching a portion of the semiconductor substrate between the isolation regions to form a first recess;
performing a first epitaxy to form a semiconductor strip in the first recess;
recessing the isolation regions, wherein a portion of the semiconductor strip over top surfaces of the recessed isolation regions forms a semiconductor fin;
forming a dummy gate to cover a middle portion of the semiconductor fin;
forming an Inter-Layer Dielectric (ILD) to cover end portions of the semiconductor fin, wherein the end portions of the semiconductor fin are on opposite sides of the middle portion;
removing the dummy gate to form a second recess;
removing the middle portion of the semiconductor fin to form a third recess;
performing a second epitaxy to grow a semiconductor material in the third recess; and
forming a gate dielectric and a gate electrode in the second recess.

16. The method of claim 15, wherein the semiconductor strip is doped to p-type or n-type through in-situ doping performed when the first epitaxy proceeds.

17. The method of claim 15, wherein the semiconductor strip is doped to p-type or n-type through an implantation performed after the first epitaxy.

18. The method of claim 15, wherein in the first epitaxy, InGaAs is grown.

19. The method of claim 15, wherein in the second epitaxy, InGaAs is grown.

20. The method of claim 15, wherein in the second epitaxy, the semiconductor material is grown to be intrinsic.

* * * * *